(12) United States Patent
Im et al.

(10) Patent No.: US 9,871,062 B2
(45) Date of Patent: Jan. 16, 2018

(54) THIN FILM TRANSISTOR ARRAY SUBSTRATE, METHOD OF MANUFACTURING THE SAME, AND DISPLAY DEVICE HAVING THE SAME

(71) Applicant: Samsung Display Co., Ltd., Yongin-si (KR)

(72) Inventors: Wan Soon Im, Yongin-si (KR); Su Wan Woo, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 52 days.

(21) Appl. No.: 14/990,459

(22) Filed: Jan. 7, 2016

(65) Prior Publication Data

US 2016/0315098 A1 Oct. 27, 2016

(30) Foreign Application Priority Data

Apr. 21, 2015 (KR) ........................ 10-2015-0056153

(51) Int. Cl.

| | |
|---|---|
| *H01L 27/12* | (2006.01) |
| *H01L 27/32* | (2006.01) |
| *H01L 51/52* | (2006.01) |
| *G02F 1/1362* | (2006.01) |
| *G02F 1/1335* | (2006.01) |

(52) U.S. Cl.
CPC ...... *H01L 27/124* (2013.01); *G02F 1/133528* (2013.01); *G02F 1/136286* (2013.01); *H01L 27/1248* (2013.01); *H01L 27/1259* (2013.01); *H01L 27/3272* (2013.01); *H01L 27/3276* (2013.01); *H01L 51/5281* (2013.01); *G02F 2001/133548* (2013.01); *G02F 2001/133567* (2013.01)

(58) Field of Classification Search
CPC .......................... H01L 27/124; H01L 27/1248
See application file for complete search history.

(56) References Cited

U.S. PATENT DOCUMENTS

| | | | |
|---|---|---|---|
| 7,589,808 | B2 | 9/2009 | Ge et al. |
| 7,965,357 | B2 | 6/2011 | Van De Witte et al. |
| (Continued) | | | |

FOREIGN PATENT DOCUMENTS

| | | |
|---|---|---|
| KR | 10-2007-0105092 | 10/2007 |
| KR | 10-2008-0087401 | 10/2008 |
| KR | 10-2014-0056545 | 5/2014 |

*Primary Examiner* — Sang V Nguyen
(74) *Attorney, Agent, or Firm* — H.C. Park & Associates, PLC

(57) ABSTRACT

A thin film transistor array substrate includes gate and data lines, a thin film transistor, a pixel electrode, a polarizing plate, and a contact line. The gate line is positioned on a base substrate, and disposed in a first direction. The data line is disposed in a second direction perpendicular to the first direction. The thin film transistor is connected to the gate and data lines. The pixel electrode is connected to the thin film transistor. The polarizing plate is positioned between the base substrate and the thin film transistor, and has a first metal pattern overlapping the thin film transistor on a plane, a second metal pattern overlapping the pixel electrode on a plane, and a third metal pattern overlapping the data line on a plane. The contact line is positioned over the data line, and connects the data line and the third metal pattern to each other.

18 Claims, 4 Drawing Sheets

(56) References Cited

U.S. PATENT DOCUMENTS

| | | | |
|---|---|---|---|
| 8,013,945 B2 | 9/2011 | Shin et al. | |
| 8,120,727 B2 | 2/2012 | Wang et al. | |
| 2008/0239210 A1* | 10/2008 | Araki | G02F 1/133555 349/96 |
| 2009/0115950 A1* | 5/2009 | Toyota | G02F 1/136213 349/114 |
| 2009/0128721 A1* | 5/2009 | Kawasaki | G02F 1/134363 349/34 |
| 2010/0002173 A1* | 1/2010 | Otani | G02F 1/133555 349/114 |
| 2010/0079706 A1* | 4/2010 | Kim | G02B 5/3058 349/96 |
| 2012/0248442 A1* | 10/2012 | Yu | G02F 1/133528 257/49 |
| 2013/0112382 A1* | 5/2013 | Brunner | F28D 1/0333 165/166 |
| 2013/0128210 A1* | 5/2013 | Nagasawa | G02F 1/13452 349/151 |
| 2014/0098330 A1* | 4/2014 | Nam | G02B 5/201 349/96 |
| 2014/0118656 A1 | 5/2014 | Jang et al. | |
| 2015/0014693 A1* | 1/2015 | Lee | H01L 27/124 257/72 |
| 2015/0042928 A1* | 2/2015 | Won | G02F 1/133377 349/96 |
| 2015/0123081 A1* | 5/2015 | Huang | H01L 27/3279 257/40 |
| 2015/0154898 A1* | 6/2015 | Jung | G09G 3/20 345/206 |
| 2015/0185574 A1* | 7/2015 | Han | G02F 1/136286 349/43 |
| 2016/0342057 A1* | 11/2016 | Zhang | H01L 21/82 |

\* cited by examiner

THIN FILM TRANSISTOR ARRAY SUBSTRATE, METHOD OF MANUFACTURING THE SAME, AND DISPLAY DEVICE HAVING THE SAME

RELATED APPLICATIONS

This application claims priority from and the benefit of Korean Patent Application No. 10-2015-0056153, filed on Apr. 21, 2015, which is hereby incorporated by reference for all purposes as if fully set forth herein.

BACKGROUND

Field

Exemplary embodiments relate to a thin film transistor array substrate, a method of manufacturing the same, and a display device having the same.

Discussion of the Background

Various display devices capable of displaying information have been widely developed. These display devices include a liquid crystal display device, a plasma display panel, an electrophoretic display device, an organic light emitting display device, and the like.

Meanwhile, as display devices become larger in size and higher in resolution, a signal delay (RC delay) of lines may occur, and various studies on a low-resistance line processes have been conducted to minimize the signal delay (RC delay).

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a thin film transistor array substrate, a method of manufacturing the same, and a display device having the same which minimizes a signal delay (RC delay) by reducing resistance of lines.

Additional aspects will be set forth in the detailed description which follows, and, in part, will be apparent from the disclosure, or may be learned by practice of the inventive concept.

An exemplary embodiment discloses a thin film transistor array substrate, including: a gate line disposed on a base substrate in a first direction; a data line disposed in a second direction perpendicular to the first direction; a thin film transistor connected to the gate line and the data line; a pixel electrode connected to the thin film transistor; a polarizing plate disposed between the base substrate and the thin film transistor, the polarizing plate including a first metal pattern overlapping the thin film transistor on a plane, a second metal pattern overlapping the pixel electrode on a plane, and a third metal pattern overlapping the data line on a plane; and a contact line disposed over the data line, the contact line connecting the data line and the third metal pattern.

An exemplary embodiment also discloses a method of manufacturing a thin film transistor array substrate, the method including: disposing a polarizing plate having first to third metal patterns on a base substrate; disposing, on the polarizing plate, a first protective layer including a first opening through which a portion of any one of the first to third metal patterns is exposed; disposing, on the first protective layer, a gate line and a gate electrode extending from the gate line; disposing, over the gate line and the gate electrode, a gate insulating layer having a second opening formed to correspond to the position of the first opening; disposing, on the gate insulating layer, a semiconductor layer, a data line, a source electrode extending from the data line, and a drain electrode spaced apart from the source electrode; forming, over the data line, the source electrode, and the drain electrode, a second protective layer having a third opening formed to correspond to the position of the second opening, a fourth opening through which the data line is exposed, and a contact hole through which a portion of the drain electrode is exposed; and disposing a pixel electrode connected to the drain electrode through the contact hole, and forming a contact line in contact with the data line through the fourth opening and connected to the metal pattern exposed through the first to third openings.

An exemplary embodiment further discloses a display device including: a gate line disposed on a base substrate in a first direction; a data line disposed in a second direction perpendicular to the first direction; a thin film transistor connected to the gate line and the data line; a display element connected to the thin film transistor; a polarizing plate disposed between the base substrate and the thin film transistor, the polarizing plate including a first metal pattern overlapping the thin film transistor on a plane, a second metal pattern overlapping the first electrode on a plane, and a third metal pattern overlaying the data line on a plane; and a contact line disposed over the data line along the second direction, the contact line electrically connecting the data line and the third metal pattern, wherein the first metal pattern overlaps the thin film transistor on a plane, the second metal pattern overlaps the pixel electrode on a plane, and the third metal pattern overlaps the data line on a plane.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
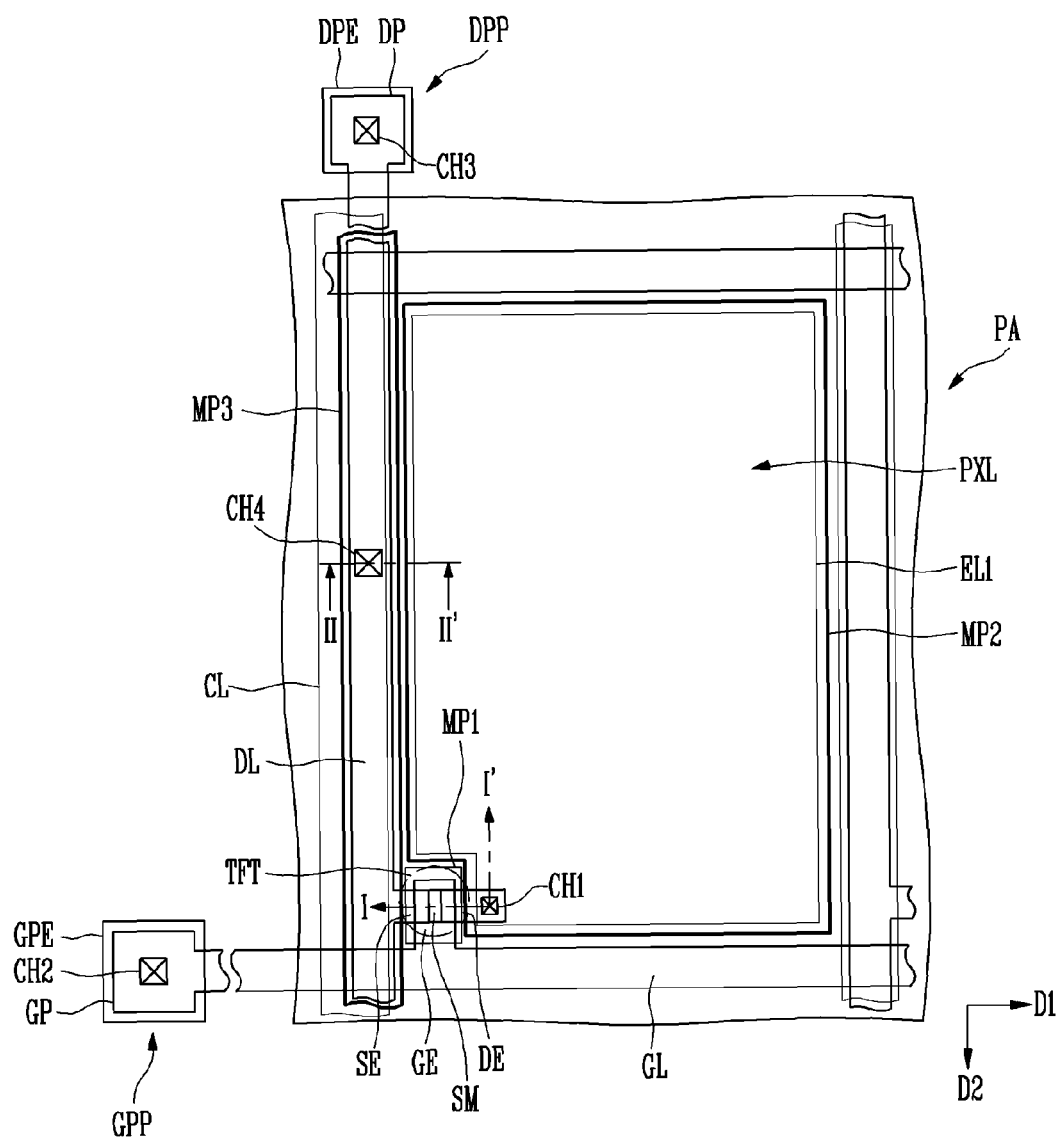
FIG. 1 is a plan view illustrating a pixel area of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
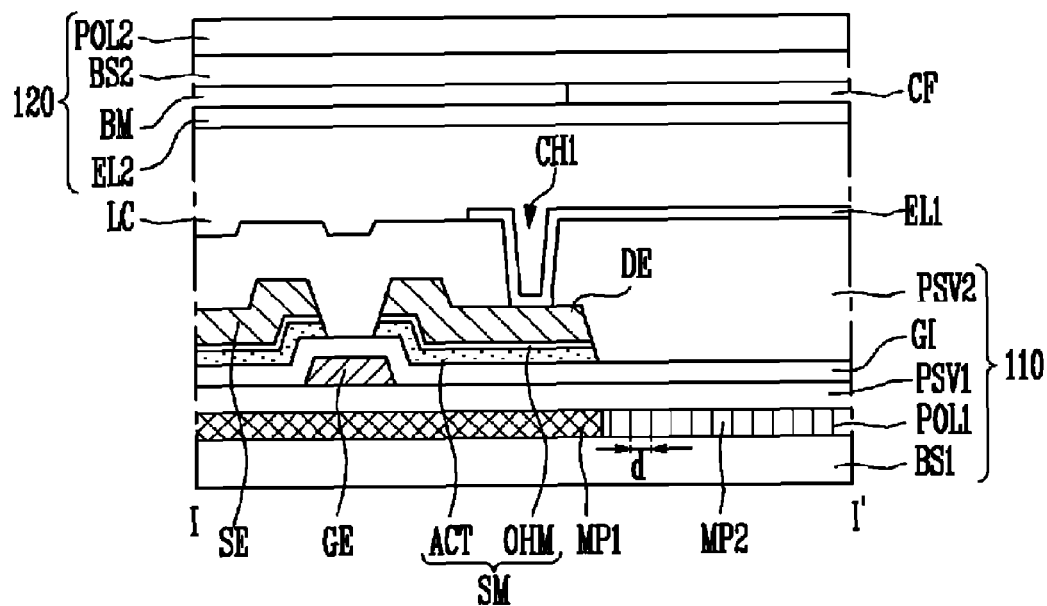
FIG. 2 is a sectional view taken along section line I-I' in the pixel area of FIG. 1.
Figure 3:
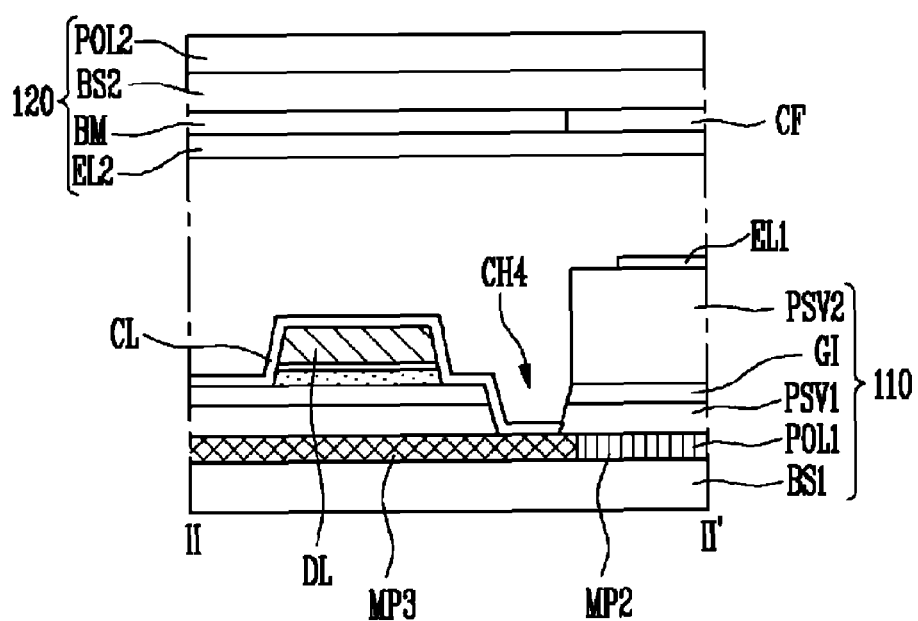
FIG. 3 is a sectional view taken along section line II-II' in the pixel area of FIG. 1.

FIG. 1 is a plan view illustrating a pixel area of a display device according to an exemplary embodiment. FIG. 2 is a sectional view taken along section line I-I' in the pixel area of FIG. 1. FIG. 3 is a sectional view taken along section line II-II' in the pixel area of FIG. 1. The display device according to an exemplary embodiment may include a liquid crystal display device, an organic light emitting display device, and the like. However, for convenience of illustration, a liquid crystal display device will be described as an example of the display device.

Referring to FIGS. 1, 2, and 3, the liquid crystal display device may include a plurality of pixels PXL, and the pixels PXL may be arranged in a matrix form having a plurality of data lines DL and a plurality of gate lines GL. The pixels PXL may have the same structure as each other. Although the pixel PXL shown in FIG. 1 has a rectangular shape extending long in one direction, the present invention is not limited thereto.

The liquid crystal display device may include a first substrate 110, a second substrate 120 opposite to the first substrate 110, and a liquid crystal layer LC formed or otherwise disposed between the two substrates 110 and 120.

The first substrate 110 may include a first base substrate BS1, a first polarizing plate POL1 disposed on one surface of the first base substrate BS1, a thin film transistor TFT disposed on the first polarizing plate POL1, a first electrode EL1 connected to the thin film transistor TFT, and a contact line CL formed or otherwise disposed over a data line DL. The first substrate 110 may include the thin film transistor TFT and hence may be referred to as a thin film transistor array substrate.

The first base substrate BS1 may be a rigid type base substrate. Alternatively, the first base substrate BS1 may be a flexible type base substrate. The rigid type base substrate may be, for example, one of a glass base substrate, a quartz base substrate, a glass ceramic base substrate, and a crystalline glass base substrate. The flexible type base substrate may be, for example, one of a film base substrate including a polymer organic material and a plastic base substrate. The material applied to the first base substrate BS1 may have resistance (or heat resistance) against a high processing temperature in a manufacturing process.

The first base substrate BS1 may be divided into a pixel area PA in which the plurality of pixels PXL are arranged, a data pad portion DPP disposed on at least one side of the pixel area PA, and a gate pad portion GPP.

The first polarizing plate POL1 may be disposed on the first base substrate BS1. The first polarizing plate POL1 may include first metal pattern MP1, second metal pattern MP2, and third metal pattern MP3. The first metal pattern MP1 may be provided in the first polarizing plate POL1 to overlap the thin film transistor TFT on a plane. The second metal pattern MP2 may be provided in the first polarizing plate POL1 to overlap the first electrode EL1 on a plane. The third metal pattern MP3 may be provided in the first polarizing plate POL1 to overlap the data line DL on a plane.

The first to third metal patterns MP1, MP2, and MP3 may be made of the same conductive material, but aspects of the invention are not limited thereto.

The first to third metal patterns MP1, MP2, and MP3 may include a metal having relatively higher reflexibility. For example, the first to third metal patterns MP1, MP2, and MP3 may include, for example, one of aluminum, gold, silver, copper, chrome, iron, nickel, molybdenum, and alloy thereof. The first to third metal patterns MP1, MP2, and MP3 may include, for example, aluminum having a relatively higher reflexibility among the listed metals.

The first to third metal patterns MP1, MP2, and MP3 may have a single-layered structure including one or more of the above listed metals. The first to third metal patterns MP1, MP2, and MP3 may have a multi-layered structure formed by laminating two or more layers each including one or more of the above listed metals. For example, the first to third metal patterns MP1, MP2, and MP3 may have a double-layered structure having a lower layer including aluminum and an upper layer including titanium. Alternatively, for example, the first to third metal patterns MP1, MP2, and MP3 may have a double-layered structure having a lower layer including aluminum and an upper layer including molybdenum.

The first metal pattern MP1 may overlap the thin film transistor TFT of the first substrate 110 and also overlap a black matrix BM provided in the second substrate 120. Since the first metal pattern MP1 is disposed under the thin film transistor TFT, light may not be transmitted through the first metal pattern MP1, and the first metal pattern MP1 may not perform the function of polarization. The first metal pattern MP1 may function as a light shielding portion to prevent light from being transmitted through the thin film transistor TFT.

The second metal pattern MP2 may include a plurality of fine patterns formed in parallel along a first direction D1. The plurality of fine patterns may be formed in a stripe shape to have a predetermined distance d between adjacent fine patterns. The second metal pattern MP2 may be configured as a wire grid polarizer (WGP). The plurality of fine patterns may have, for example, a height of about 150 nm or more, and the distance d between adjacent fine patterns may be about 100 nm or less.

The third metal pattern MP3 may overlap the data line DL along a second direction D2 on the first base substrate BS1. The third metal pattern MP3 may also overlap the black matrix BM on a second base substrate BS2. When the third metal pattern MP3 overlaps the black matrix BM and is disposed under the data line DL, light is not transmitted through the third metal pattern MP3, and the third metal pattern MP3 does not perform the function of polarization. The third metal pattern MP3 may have the same size as the black matrix BM to prevent light leakage.

A first protective layer PSV1 may be disposed on the first polarizing plate POL1. The first protective layer PSV1 may cover the first polarizing plate POL1. The first protective layer PSV1 may include, for example, any one of silicon oxide ($SiO_x$) and silicon nitride ($SiN_x$).

A gate line GL may be disposed on the first protective layer PSV1. The gate line GL may extend along the first direction D1 in the pixel area PA.

A gate insulating layer GI may be disposed over the gate line GL. The gate insulating layer GI may include, for example, at least one of silicon oxide ($SiO_x$) and silicon nitride ($SiN_x$). The data line DL may be disposed above the gate insulating layer GI.

The data line DL may extend in the second direction D2 intersecting the gate line GL disposed along the first direction D1 on the first base substrate BS1. That is, the data line DL may be insulated from the gate line GL by the gate insulating layer GI.

The thin film transistor TFT may be connected to the gate line GL and the data line DL in the pixel PXL. The thin film transistor TFT may include a gate electrode GE, a semiconductor layer SM, a source electrode SE, and a drain electrode DE.

The gate electrode GE may have a shape protruding from the gate line GL. Alternatively, the gate electrode GE may be a partial region of the gate line GL. The gate line GL and the gate electrode GE may include, for example, at least one of nickel, chrome, molybdenum, aluminum, titanium, copper, tungsten, and alloy thereof. The gate line GL and the gate electrode GE may have a single-layered structure or multi-layered structure including one or more of the listed metals. For example, the gate line GL and the gate electrode GE may have a triple-layered structure in which molybdenum, aluminum, and molybdenum are sequentially laminated. Alternatively, the gate line GL and the gate electrode GE may have a double-layered structure in which titanium and copper are sequentially laminated. Alternatively, the gate line GL and the gate electrode GE may have a single-layered structure including an alloy of titanium and copper. These are exemplary embodiments and aspects of the invention are not limited thereto.

The gate electrode GE is insulated by the gate insulating layer GI.

The semiconductor layer SM may be disposed on the gate insulating layer GI, and at least one portion of the semiconductor layer SM may overlap the gate electrode GE. The semiconductor SM may include a semiconductor active layer ACT disposed on the gate insulating layer GI and an ohmic contact layer OHM disposed on the semiconductor active layer ACT.

The semiconductor active layer ACT may include any one of amorphous silicon (a-Si), polycrystalline silicon (p-Si), and semiconductor oxide. For example, the semiconductor oxide may include at least one of zinc (Zn), indium (In), gallium (Ga), tin (Sn), and mixture thereof. The semiconductor oxide may include, for example, indium-gallium-zinc oxide (IGZO).

The ohmic contact layer OHM may have a shape branched from the semiconductor active layer ACT and the source electrode SE or the drain electrode DE. The drain electrode DE may be coupled to the other side of the semiconductor layer SM. The drain electrode DE may be disposed to be spaced apart from the source electrode SE. In the semiconductor layer SM, the region between the source electrode SE and the drain electrode DE may be a conductive channel.

The data line DL, the source electrode SE, and the drain electrode DE may include, for example, at least one of nickel, chrome, molybdenum, aluminum, titanium, copper, tungsten, and alloy thereof. The data line DL, the source electrode SE, and the drain electrode DE may have a triple-layered structure in which molybdenum, aluminum, and molybdenum are sequentially laminated. Alternatively, the data line DL, the source electrode SE, and the drain electrode DE may have a double-layered structure in which titanium and copper are sequentially laminated. These are exemplary embodiments and aspects of the invention are not limited thereto.

A second protective layer PSV2 may be disposed over the source electrode SE and the drain electrode DE. The second protective layer PSV2 may include at least one layer. For example, the second protective layer PSV2 may include an inorganic protective layer and an organic protective layer disposed on the inorganic protective layer. The inorganic protective layer may include, for example, at least one of silicon oxide and silicon nitride. The organic protective layer may include any one of acryl, polyimide (PI), polyamide (PA), and benzocyclobutene (BCB). The organic protective layer may be a planarization layer which is transparent and can reduce and planarize winding of a lower structure. The second protective layer PSV2 may include a first contact hole CH1 through which a portion of the drain electrode DE is exposed and a fourth contact hole CH4 through which a portion of the third metal pattern MP3 of the first polarizing plate POL1 and the data line DL are exposed.

The first electrode EL1 and the contact line CL may be disposed on the second protective layer PSV2. The first electrode EL1 and the contact line CL may include a transparent conductive oxide. The transparent conductive oxide may be, for example, one of indium tin oxide (ITO), indium zinc oxide (IZO), aluminum zinc oxide (AZO), gallium doped zinc oxide (GZO), zinc tin oxide (ZTO), gallium tin oxide (GTO), and fluorine doped tin oxide (FTO).

The first electrode EL1 may be in contact with the drain electrode DE through the first contact hole CH1 provided in the second protective layer PSV2.

The contact line CL may be in contact with the data line DL and the third metal pattern MP3 through the fourth contact hole CH4. The contact line CL may function as a bridge through which the third metal pattern MP3 and the data line DL are electrically connected to each other. When the third metal pattern MP3 and the data line DL are electrically connected to each other through the contact line CL, the data line DL may form a line of a double structure. Accordingly, the resistance of the data line DL can be decreased, thereby minimizing a signal delay (RC delay).

When the contact line CL and the data line DL overlap each other on the second protective layer PSV2, the position of the fourth contact hole CH4 in the second protective layer PSV2 may be modified. For example, the fourth contact hole CH4 may be formed at a position where the aperture damage in the pixel area PA is minimized. The fourth contact hole CH4 may be located in the data pad portion DPP corresponding to the start point of the data line in the pixel area PA such that the contact line CL is electrically connected to the data line DL and the third metal pattern MP3.

The second substrate 120 may include the second base substrate BS2, a second polarizing plate POL2, a color filter CF, the black matrix BM, and a second electrode EL2.

The second base substrate BS2 is disposed opposite to the first base substrate BS1, and may include the same material as the first base substrate BS1, but aspects of the invention are not limited thereto.

The second polarizing plate POL2 may be formed or otherwise disposed on an upper surface of the second base substrate BS2. The second polarizing plate POL2 may polarize light advancing from the direction of the first substrate 110 to the direction of the second substrate 120. The second polarizing plate POL2 may polarize light transmitted through the liquid crystal layer LC.

The color filter CF may be provided in the second base substrate BS2. The color filter CF may provide a color to light transmitted through the pixels PXL. The color filter CF may be one of a red color filter, a green color filter, and a blue color filter. Alternatively, the color filter CF may be one of a cyan color filter, a magenta color filter, and a yellow color filter. The second substrate 120 may include the color filter CF. However, the present invention is not limited thereto. For example, the first substrate 110 may include the color filter CF.

The black matrix BM may block unnecessary light when the liquid crystal display device displays images. The black matrix BM may be provided at one side of the color filter CF. For example, the black matrix BM may be disposed at the circumference of the color filter CF, corresponding to the circumference of the pixels PXL. Although not shown, the color filter CF and the black matrix BM may overlap each other in a region adjacent to the boundary between the pixels PXL.

The second electrode EL2 may be disposed on the color filter CF and the black matrix BM. The second electrode EL2 forms an electric field with the first electrode EL1. The second electrode EL2 may be made of the same material as the first electrode EL1. When the second electrode EL2 is applied to the liquid crystal display device as shown in FIG. 2, the second electrode EL2 may be a common electrode. However, the present invention is not limited thereto. When the second electrode EL2 is applied to an organic light emitting display device, for example, the second electrode EL2 may be a cathode electrode.

The liquid crystal layer LC may be disposed or formed between the first substrate 110 and the second substrate 120. The liquid crystal layer LC may include liquid crystal molecules having optical anisotropy. The liquid crystal molecules may be arranged by the electric field formed between the first electrode EL1 and the second electrode EL2, to transmit or block light.

The gate pad portion GPP is electrically connected to the gate line GL disposed along the first direction D1 on the first base substrate BS1, and the data pad portion DPP is electrically connected to the data line DL disposed along the second direction D2 perpendicular to the first direction D1.

The gate pad portion GPP may include a gate pad GP and a gate pad electrode GPE connected to the gate pad GP. The gate pad GP may be disposed on the first protective layer PSV1. The gate insulating layer GI and the second protective layer PSV2 may cover the gate pad GP and have a second contact hole CH2 through which the gate pad GP is exposed. The gate pad electrode GPE may be connected to the gate pad GP through the second contact hole CH2. Thus, the gate pad electrode GPE may electrically connect the gate pad GP and the gate line GL.

The data pad portion DPP includes a data pad DP and a data pad electrode DPE connected to the data pad DP. The data pad DP may be disposed on the gate insulating layer GI. The second protective layer PSV2 may cover the data pad DP and has a third contact hole CH3 through which the data pad DP may be exposed. The data pad electrode DPE may be connected to the data pad DP through the third contact hole CH3. Thus, the data pad electrode DPE may electrically connect the data pad DP and the data line DL.

In an exemplary embodiment, the gate pad portion GPP and the data pad portion DPP may be electrically connected to external lines. However, the present invention is not limited thereto. For example, a gate driver including a plurality of amorphous silicon transistors may be provided instead of the gate pad portion GPP. The amorphous silicon transistors may be directly arranged on a pad area of the first base substrate BS1 through a process of manufacturing the thin film transistors.

In an exemplary embodiment, the display device is described as the liquid crystal display device, but the present invention is not limited thereto. For example, features of an exemplary embodiment may also be applied to an organic light emitting display having an organic light emitting layer which emits light between the first electrode EL1 and the second electrode EL.

FIGS. 4, 5, 6, 7, 8, and 9 are sectional views sequentially illustrating a method of manufacturing the first substrate shown in FIG. 3.

Figure 4:
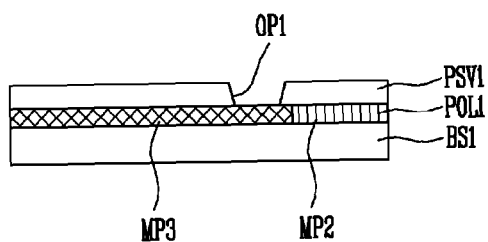
FIG. 4, FIG. 5, FIG. 6, FIG. 7, FIG. 8, and FIG. 9 are sectional views sequentially illustrating a method of manufacturing a first substrate shown in FIG. 3 according to an exemplary embodiment.

Referring to FIGS. 3 and 4, a first polarizing plate POL1 is disposed on a first base substrate BS1. The first polarizing plate POL1 includes a second metal pattern MP2 and a third metal pattern MP3. The first polarizing plate POL1 may be formed by forming a conductive layer (not shown) on the first base substrate BS1 by using sputtering, chemical vapor deposition, evaporation, and the like, and patterning the conductive layer through an etching process to include a first metal pattern MP1, the second metal pattern MP2, and the third metal pattern MP3.

The first metal layer MP1 may be patterned on the first base substrate BS1 to correspond to the position of a thin film transistor (TFT of FIG. 2). The second metal pattern MP2 may be patterned on the first base substrate BS1 to correspond to the position of a first electrode EL1. The third metal pattern MP3 may be patterned on the first base substrate BS1 to correspond to the position of a data line DL. The second metal pattern MP2 may be configured as a wire grid polarizer (WGP) including a plurality of fine patterns formed in parallel on a surface of the first base substrate BS1.

The first to third metal patterns MP1, MP2, and MP3 may be located on the same layer and made of the same conductive material.

A first protective layer PSV1 may be formed on the first polarizing plate POL1. The first protective layer PSV1 is patterned to include a first opening OP1 through which a portion of the third metal pattern MP3 of the first polarizing plate POL1 is exposed to the outside. The first protective layer PSV1 may be patterned through a mask process. For example, an insulating material and a photosensitive layer may be sequentially formed on the first polarizing plate POL1, and a mask (not shown) having a light transmitting portion and a light shielding portion may be disposed above the photosensitive layer. Subsequently, the first protective layer PSV1 having the first opening OP1 may be formed on the first polarizing plate POL1 by performing a mask process including a series of unit processes of exposure, development, and the like. The first protective layer PSV1 may include, for example, any one of silicon oxide ($SiO_x$) and silicon nitride ($SiN_x$).

Figure 5:
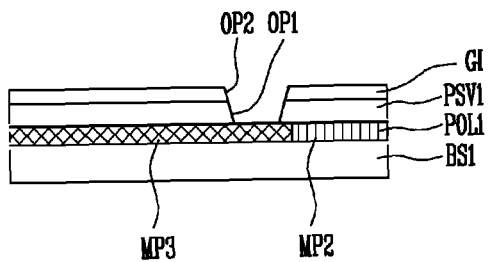

Referring to FIG. 5, a gate insulating layer GI may be formed on the first protective layer PSV1 including the first opening OP1. The gate insulating layer GI is patterned to include a second opening OP2 corresponding to the first opening OP1. The gate insulating layer GI may be patterned through a mask process. For example, an insulating material and a photosensitive layer may be sequentially formed on the first protective layer PSV1, and a mask (not shown) may be disposed above the photosensitive layer. Subsequently, the gate insulating layer GI having the second opening OP2 may be formed on the first protective layer PSV1 by performing a mask process including a series of processes of exposure, development, and the like. The gate insulating layer GI may include, for example, at least one of silicon oxide ($SiO_x$) and silicon nitride ($SiN_x$).

Figure 6:
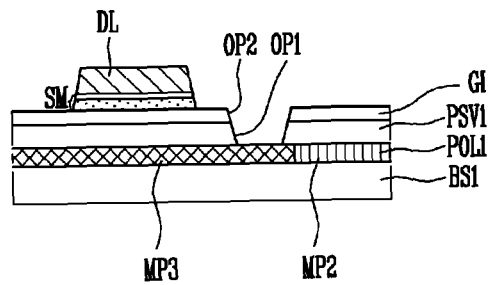

Referring to FIG. 6, a semiconductor layer SM and the data line DL may be disposed on the gate insulating layer GI. The semiconductor layer SM and the data line DL may be patterned to overlap the third metal pattern MP3 of the first polarizing plate POL1.

Figure 7:
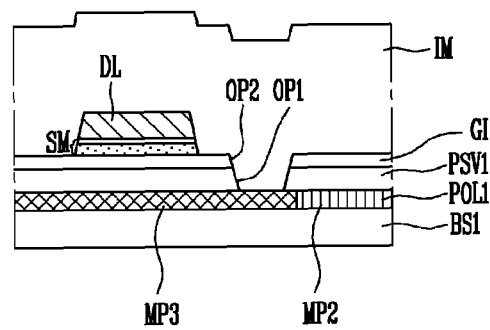

Referring to FIG. 7, an insulating material IM may be disposed on the entire surface of the first base substrate BS1 on which the data line DL is formed. The insulating material IM may include an inorganic insulating material and an organic insulating material disposed on the inorganic insulating material. The inorganic insulating material may include, for example, at least one of silicon oxide and silicon nitride. The organic insulating material may include, for example, any one of acryl, polyimide (PI), polyamide (PA), and benzocyclobutene (BCB).

Figure 8:
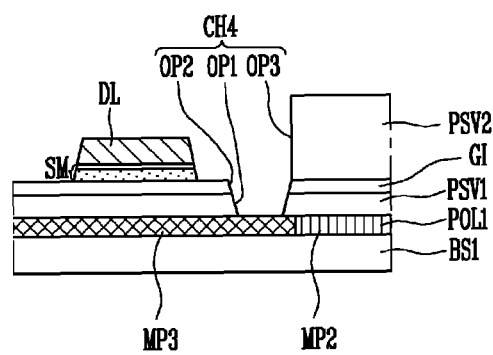

A photosensitive layer (not shown) may be formed on the entire surface of the first base substrate BS1 on which the insulating material IM is disposed, and a mask (not shown) having a light transmitting portion and a light shielding portion may be disposed above the photosensitive layer. Subsequently, a second protective layer PSV2 including a third opening OP3 corresponding to the first opening OP1 and the second opening OP2 may be formed, as shown in FIG. 8, by performing a mask process including a series of processes of exposure, development, and the like. The first to third openings OP1 to OP3 constitute a fourth contact hole CH4, and the second protective layer PSV2 may be patterned to expose the data line DL.

Figure 9:
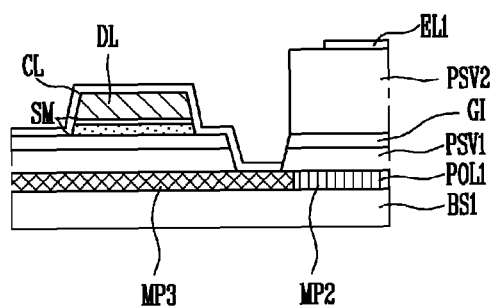

Referring to FIG. 9, the first electrode EL1 and a contact line CL may be disposed on the second protective layer PSV2. The first electrode EL1 may be connected to the thin film transistor (TFT of FIG. 1), and the contact line CL may be directly disposed on the data line DL exposed. The contact line CL may be directly disposed on the third metal layer MP3 of the first polarizing plate POL1 exposed through the fourth contact hole CH4. The contact line CL may be electrically connected to the third metal pattern MP3 while being electrically connected to the data line DL.

Therefore, the data line DL and the third metal pattern MP3 of the first polarizing plate POL1 may be electrically connected to each other through the contact line CL. As the data line DL is electrically connected to the third metal pattern MP3 through the contact line CL, the data line DL may form a line of a double structure. When the data line DL forms the line of the double structure, reducing a signal delay (RC delay) due to larger size and higher resolution of the display device may be possible.

Further, the third metal pattern MP3 may be formed under the data line DL to have the same size as a black matrix without performing the function of polarization, to prevent light leakage of a region in which the data line DL is disposed.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A thin film transistor array substrate, comprising:
a first protective layer disposed on a base substrate;
a gate line disposed on the base substrate in a first direction;
a data line disposed in a second direction perpendicular to the first direction;
a thin film transistor connected to the gate line and the data line and disposed on the first protective layer;
a pixel electrode connected to the thin film transistor;
a polarizing plate disposed between the base substrate and the first protective layer, the polarizing plate comprising a first metal pattern overlapping the thin film transistor on a plane, a second metal pattern overlapping the pixel electrode on a plane, and a third metal pattern overlapping the data line on a plane; and
a contact line disposed over the data line, the contact line connecting the data line and the third metal pattern, a part of the contact line being directly disposed on the data line,
wherein the first metal pattern, the second metal pattern, and the third metal pattern are disposed on the same layer under the first protective layer, and
wherein the data line is electrically connected to the third metal pattern through the contact line and comprises a line of a double structure.

2. The thin film transistor array substrate of claim 1, wherein the first protective layer is disposed between the third metal pattern and the data line, and a second protective layer is disposed between the data line and the contact line.

3. The thin film transistor array substrate of claim 2, wherein the first protective layer comprises a first contact hole through which a portion of the third metal pattern is exposed, and the second protective layer comprises a second contact hole formed to correspond to a position of the first contact hole and a third contact hole through which the data line is exposed.

4. The thin film transistor array substrate of claim 3, wherein the contact line is in contact with the third metal pattern exposed through the first contact hole and the second contact hole, and in contact with the data line exposed through the third contact hole.

5. The thin film transistor array substrate of claim 4, wherein the data line and the third metal pattern are connected to each other through the contact line.

6. The thin film transistor array substrate of claim 1, wherein the contact line and the pixel electrode are disposed on the same layer and comprise the same conductive material.

7. The thin film transistor array substrate of claim 1, wherein the first to third metal patterns comprise the same conductive material.

8. The thin film transistor array substrate of claim 1, wherein the second metal pattern comprises a wire grid polarizer (WGP).

9. A method of manufacturing a thin film transistor array substrate, the method comprising:
disposing a polarizing plate comprising a first metal pattern, a second metal pattern, and a third metal pattern on a base substrate;
disposing, on the polarizing plate, a first protective layer comprising a first opening through which a portion of any one of the first to third metal patterns is exposed;
disposing, on the first protective layer, a gate line and a gate electrode extending from the gate line;
disposing, over the gate line and the gate electrode, a gate insulating layer comprising a second opening formed to correspond to a position of the first opening;
disposing, on the gate insulating layer, a semiconductor layer, a data line, a source electrode extending from the data line, and a drain electrode spaced apart from the source electrode;
disposing, over the data line, the source electrode, and the drain electrode, a second protective layer comprising a third opening formed to correspond to a position of the second opening, a fourth opening through which the data line is exposed, and a contact hole through which a portion of the drain electrode is exposed; and
disposing a pixel electrode connected to the drain electrode through the contact hole, and disposing a contact line in contact with the data line through the fourth opening and connected to the metal pattern exposed through the first to third openings.

10. The method of claim 9, wherein the first metal pattern overlaps the gate electrode, the source electrode, and the drain electrode on a plane, the second metal pattern overlaps the pixel electrode on a plane, and the third metal pattern overlaps the data line on a plane.

11. The method of claim 9, wherein the second metal pattern comprises a wire grid polarizer (WGP).

12. The method of claim 9, wherein the contact line overlaps the data line on a plane.

13. The method of claim 9, wherein the contact line is disposed on the same layer as the pixel electrode, and comprises the same conductive material.

14. A display device comprising:
a first protective layer disposed on a base substrate;
a gate line disposed on the base substrate in a first direction;
a data line disposed in a second direction perpendicular to the first direction;
a thin film transistor connected to the gate line and the data line and disposed on the first protective layer;
a display element connected to the thin film transistor and comprising a pixel electrode;
a polarizing plate disposed between the base substrate and the first protective layer, the polarizing plate comprising a first metal pattern overlapping the thin film transistor on a plane, a second metal pattern overlapping the pixel electrode on a plane, and a third metal pattern overlapping the data line on a plane; and
a contact line disposed over the data line along the second direction, the contact line electrically connecting the data line and the third metal pattern, a part of the contact line being directly disposed on the data line,
wherein the first metal pattern, the second metal pattern, and the third metal pattern are disposed on the same layer under the first protective layer, and
wherein the data line is electrically connected to the third metal pattern through the contact line and comprises a line of a double structure.

15. The display device of claim 14, further comprising the first protective layer being disposed between the third metal pattern and the data line, and a second protective layer disposed between the data line and the contact line,
wherein the first protective layer comprises a first contact hole through which a portion of the third metal pattern is exposed, and the second protective layer comprises a second contact hole formed to correspond to a position of the first contact hole and a third contact hole through which the data line is exposed.

16. The display device of claim 15, wherein the contact line is in contact with the third metal pattern exposed through the first contact hole and the second contact hole, and contacted with the data line exposed through the third contact hole.

17. The display device of claim 14, wherein the display element comprises a first electrode connected to the thin film transistor, an organic light emitting layer disposed on the first electrode, and a second electrode disposed on the organic light emitting layer.

18. The display device of claim 14, wherein the display element comprises a first electrode connected to the thin film transistor, a second electrode forming an electric field with the first electrode, and a liquid crystal layer driven by the electric field.

* * * * *